United States Patent
Huang et al.

(10) Patent No.: US 8,546,183 B2
(45) Date of Patent: Oct. 1, 2013

(54) METHOD FOR FABRICATING HEAT DISSIPATING SEMICONDUCTOR PACKAGE

(75) Inventors: Chien-Ping Huang, Taichung (TW); Chih-Ming Huang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 1047 days.

(21) Appl. No.: 12/241,847

(22) Filed: Sep. 30, 2008

(65) Prior Publication Data

US 2009/0093089 A1    Apr. 9, 2009

Related U.S. Application Data

(62) Division of application No. 11/267,632, filed on Nov. 3, 2005, now Pat. No. 7,508,066.

(30) Foreign Application Priority Data

Dec. 22, 2004    (TW) ................................ 93139952 A

(51) Int. Cl.
*H01L 21/02* (2006.01)
(52) U.S. Cl.
USPC ............ 438/106; 438/121; 438/122; 438/125
(58) Field of Classification Search
USPC ........................................................ 438/122
See application file for complete search history.

(56) References Cited

U.S. PATENT DOCUMENTS

| | | | |
|---|---|---|---|
| 4,566,027 A | 1/1986 | Heitzmann et al. | |
| 5,055,911 A | 10/1991 | Ogata | |
| 5,397,921 A * | 3/1995 | Karnezos | 257/779 |
| 5,467,251 A * | 11/1995 | Katchmar | 361/719 |
| 5,485,037 A * | 1/1996 | Marrs | 257/712 |
| 5,576,577 A | 11/1996 | Takenouchi et al. | |
| 5,675,474 A | 10/1997 | Nagase et al. | |
| 5,726,079 A | 3/1998 | Johnson | |
| 5,798,570 A * | 8/1998 | Watanabe et al. | 257/796 |
| 5,835,355 A * | 11/1998 | Dordi | 361/760 |
| 6,014,317 A * | 1/2000 | Sylvester | 361/760 |
| 6,088,233 A * | 7/2000 | Iijima et al. | 361/760 |
| 6,097,085 A * | 8/2000 | Ikemizu et al. | 257/678 |
| 6,259,154 B1 | 7/2001 | Niwa | |
| 6,317,333 B1 | 11/2001 | Baba | |
| 6,326,700 B1 * | 12/2001 | Bai et al. | 257/790 |
| 6,423,622 B1 * | 7/2002 | Chen et al. | 438/598 |
| 6,429,048 B1 * | 8/2002 | McLellan et al. | 438/108 |
| 6,429,512 B1 * | 8/2002 | Huang et al. | 257/706 |

(Continued)

*Primary Examiner* — Matthew W Such
*Assistant Examiner* — William Harriston
(74) *Attorney, Agent, or Firm* — Edwards Wildman Palmer LLP; Peter F. Corless; Steven M. Jensen

(57) ABSTRACT

A heat dissipating semiconductor package and a fabrication method thereof are provided. A semiconductor chip is mounted on a chip carrier. A heat sink is mounted on the chip, and includes an insulating core layer, a thin metallic layer formed on each of an upper surface and a lower surface of the insulating core layer and a thermal via hole formed in the insulating core layer. A molding process is performed to encapsulate the chip and the heat sink with an encapsulant to form a package unit. A singulation process is performed to peripherally cut the package unit. A part of the encapsulant above the thin metallic layer on the upper surface of the heat sink is removed, such that the thin metallic layer on the upper surface of the heat sink is exposed, and heat generated by the chip can be dissipated through the heat sink.

14 Claims, 12 Drawing Sheets

(56) References Cited

U.S. PATENT DOCUMENTS

| | | | |
|---|---|---|---|
| 6,444,498 B1 * | 9/2002 | Huang et al. | 438/126 |
| 6,458,426 B1 | 10/2002 | Bulovic et al. | |
| 6,458,626 B1 * | 10/2002 | Huang et al. | 438/112 |
| 6,518,514 B2 | 2/2003 | Suzuki et al. | |
| 6,552,266 B2 * | 4/2003 | Carden et al. | 174/535 |
| 6,559,670 B1 | 5/2003 | Motamedi | |
| 6,734,552 B2 * | 5/2004 | Combs et al. | 257/707 |
| 6,753,600 B1 * | 6/2004 | Ho | 257/698 |
| 6,790,710 B2 * | 9/2004 | Fan et al. | 438/122 |
| 6,828,687 B2 * | 12/2004 | Ding | 257/778 |
| 6,841,862 B2 * | 1/2005 | Kikuchi et al. | 257/680 |
| 6,980,438 B2 * | 12/2005 | Huang et al. | 361/719 |
| 7,148,554 B2 * | 12/2006 | Nah et al. | 257/532 |
| 7,164,210 B2 * | 1/2007 | Tsai et al. | 257/796 |
| RE39,957 E * | 12/2007 | Huang et al. | 438/106 |
| 7,371,617 B2 * | 5/2008 | Tsai et al. | 438/124 |
| 7,602,060 B2 * | 10/2009 | Yeh | 257/718 |
| 8,362,364 B2 * | 1/2013 | Asano et al. | 174/260 |
| 2002/0001937 A1 * | 1/2002 | Kikuchi et al. | 438/618 |
| 2002/0079570 A1 * | 6/2002 | Ho et al. | 257/697 |
| 2002/0180035 A1 * | 12/2002 | Huang et al. | 257/706 |
| 2004/0004281 A1 * | 1/2004 | Bai et al. | 257/706 |
| 2005/0036291 A1 * | 2/2005 | Huang et al. | 361/704 |
| 2006/0172457 A1 * | 8/2006 | Huang | 438/106 |

* cited by examiner

US 8,546,183 B2

METHOD FOR FABRICATING HEAT DISSIPATING SEMICONDUCTOR PACKAGE

CROSS-REFERENCE TO RELATED APPLICATION(S)

This application is a divisional of application U.S. Ser. No. 11/267,632, filed on Nov. 3, 2005 now U.S. Pat. No. 7,508,066.

FIELD OF THE INVENTION

The present invention relates to heat dissipating semiconductor packages and fabrication methods thereof, and more particularly, to a semiconductor package with a heat sink and a method for fabricating the semiconductor package.

BACKGROUND OF THE INVENTION

Ball Grid Array (BGA) packaging technology, which is a well-known advanced technology in the relevant art, is performed in a manner as to mount a semiconductor chip on a front side of a substrate and implant a grid array of solder balls on a back side of the substrate. The solder balls are used to electrically connect the entire package unit to an external printed circuit board. The BGA packaging technology advantageously incorporates more I/O (input/output) connections within the same unit area of a chip carrier (e.g. the substrate) such that the high integration requirement of the semiconductor chip is satisfied.

The highly integrated semiconductor chip during operation usually produces a large amount of heat. As the semiconductor chip is encapsulated by an encapsulant that is made of a resin material having poor thermal conductivity (a coefficient of thermal conductivity thereof is only 0.8 w/m-k), the heat produced from the semiconductor chip cannot be effectively dissipated through the encapsulant. This results in unsatisfactory heat dissipating efficiency and adversely affects the performance and lifetime of the semiconductor chip.

Accordingly, a thermally enhanced BGA semiconductor package incorporated with a heat dissipating structure has been proposed in order to improve the heat dissipating efficiency of the semiconductor package.

As shown in FIG. 1 for a semiconductor package 1 disclosed by U.S. Pat. No. 5,726,079, there is a heat sink 11 directly attached to a chip 10, wherein a top surface 11a of the heat sink 11 is exposed to the atmosphere from an encapsulant 12 that encapsulates the chip 10, such that heat generated by the chip 10 can be transferred to the heat sink 11 and dissipated to the atmosphere without having to pass through the encapsulant 12 that has poor thermal conductivity.

However, the semiconductor package 1 causes significant drawbacks during fabrication thereof. After the heat sink 11 is attached to the chip 10, the structure of combined heat sink 11 and chip 10 is placed into a mold cavity of an encapsulation mold (not shown) to perform a molding process for forming the encapsulant 12. As the top surface 11a of the heat sink 11 is intended being exposed, the top surface 11a must abut against a top wall of the mold cavity during molding. However, if the top surface 11a of the heat sink 11 fails to effectively abut against the top wall of the mold cavity, resin flashes of the encapsulant 12 are formed on the top surface 11a of the heat sink 11, which not only deteriorate the heat dissipating efficiency but also impair appearance of the fabricated product. In such case, an additional deflashing process is usually required to remove the flashes, which undesirably prolongs the fabrication time, increases fabrication costs, and possibly damages the fabricated product. On the other hand, too close contact between the heat sink 11 and the top wall of the mold cavity may lead to cracking of the fragile chip 10 by excessive pressure from the encapsulation mold.

In particular, if a distance between the top surface 11a of the heat sink 11 and an upper surface of a substrate 13 where the chip 10 is mounted is larger than a depth of the mold cavity, during the molding process, the heat sink 11 is pressed by the upper mold and thus the chip 10 directly in contact with the heat sink 11 is cracked. On the contrary, if the distance between the top surface 11a of the heat sink 11 and the upper surface of the substrate 13 is smaller than the depth of the mold cavity, resin flashes of the encapsulant 12 are formed on the top surface 11a of the heat sink 11 during molding, which undesirably decrease an exposed area of the top surface 11a of the heat sink 11 and reduce the heat dissipating efficiency.

To make the distance between the top surface 11a of the heat sink 11 and the upper surface of the substrate 13 equal to the depth of the mold cavity, attachment between the chip 10 and the heat sink 11, attachment between the chip 10 and the substrate 13, and the thickness of the heat sink 11 must be precisely performed and controlled, such that the packaging costs and process complexity in fabrication are increased. Further by such requirement on precision, the heat sink 11 can only be attached to the chip 10 one by one rather than a batch-type method, thereby increasing the fabrication time and reducing the packaging efficiency.

Since the heat dissipating efficiency of the semiconductor package 1 is proportional to the exposed area of the top surface 11a of the heat sink 11, the heat sink 11 when having the same surface area as the semiconductor package 1 would have the maximum exposed area to provide the maximum heat dissipating efficiency under a condition with a constant size of the semiconductor package 1. To achieve this arrangement, sides of the heat sink should be flush or engaged with side walls of the mold cavity during the molding process. However, if the heat sink is inaccurately fabricated and oversized, it cannot be successfully placed into the mold cavity; or, if the heat sink is undersized, resin flashes of the encapsulant may easily occur on the top surface or sides of the heat sink. Therefore, such structural arrangement causes a yield concern and difficulty in fabrication.

In view of the foregoing drawbacks, U.S. Pat. Nos. 6,458,626 and 6,444,498 disclose a semiconductor package with a heat sink being directly attached to a chip without causing chip cracking or resin flashes on an exposed surface of the heat sink, as shown in FIGS. 2A to 2C and FIG. 3. In this semiconductor package, an interface layer 25 is formed on a surface of a heat sink 21 to be exposed to the atmosphere, and has poor adhesion with an encapsulant 24 or the heat sink 21. Then, the heat sink 21 is directly attached to a chip 20 mounted on a substrate 23. A molding process is performed to form the encapsulant 24 for encapsulating the heat sink 21, the chip 20 and the interface layer 25 on the heat sink 21 (as shown in FIG. 2A). The depth of a mold cavity of an encapsulation mold used in the molding process is made larger than the sum of the chip 20 and the heat sink 2 in thickness, such that the encapsulation mold does not come into contact with and press the heat sink 21 and the chip 20 is not cracked during molding. Subsequently, a singulation process is performed (as shown in FIG. 2B), and the encapsulant 24 above the heat sink 21 is removed. If the adhesion between the heat sink 21 and the interface layer 25 (such as a plated gold layer) is larger than that between the interface layer 25 and the encapsulant 24, the interface layer 25 remains on the heat sink 21 after the encapsulant 24 above the heat sink 21 is removed, and no residue of the encapsulant 24 is left on the heat sink 21

(as shown in FIG. 2C), thereby no flash problem. On the contrary, if the adhesion between the interface layer 25 (such as an adhesive tape made of polyimide resin) and the heat sink 21 is smaller than that between the interface layer 25 and the encapsulant 24, the interface layer 25 is removed together with removal of the encapsulant 24 above the heat sink 21 (as shown in FIG. 3), such that no flash of the encapsulant 24 occurs on the heat sink 21.

However, during the singulation process for the above semiconductor package, a cutting tool is required to directly cut through the heat sink that is typically made of a relatively thick and rigid metal, such that uneven cutting sides having acute-angled saws or burrs are produced at peripheral sides of the singulated heat sink no matter whether a punching method or a diamond cutting tool is used for singulation. This drawback not only adversely influences the appearance of the semiconductor package but also makes the punching tool or the cutting tool wear faster, thereby leading to a great increase in cost and decrease in production efficiency.

Therefore, the problem to be solved here is to provide a heat dissipating semiconductor package and a fabrication method thereof, which can overcome the foregoing drawbacks

SUMMARY OF THE INVENTION

In light of the foregoing drawbacks of the conventional technology, an objective of the present invention is to provide a heat dissipating semiconductor package and a fabrication method thereof, which can avoid burrs being produced for a heat sink and wear of a cutting tool in a singulation process.

Another objective of the present invention is to provide a heat dissipating semiconductor package and a fabrication method thereof to reduce the cutting cost in the singulation process.

Still another objective of the present invention is to provide a heat dissipating semiconductor package and a fabrication method thereof, which can avoid chip cracks and resin flashes in a molding process with the heat sink being integrated in the semiconductor package, so as to improve the yield of the fabricated product.

In accordance with the above and other objectives, the present invention proposes a fabrication method of a heat dissipating semiconductor package, comprising the steps of: mounting and electrically connecting at least one semiconductor chip to a chip carrier; mounting a heat sink on the semiconductor chip, wherein the heat sink includes an insulating core layer, a thin metallic layer formed on each of an upper surface and a lower surface of the insulating core layer, and at least one thermal via hole formed in the insulating core layer; performing a molding process to form an encapsulant for completely encapsulating the semiconductor chip on the chip carrier and the heat sink so as to form a package unit; and performing a singulation process to peripherally cut the package unit to expose sides of the heat sink, and removing a part of the encapsulant above the thin metallic layer on the upper surface of the heat sink such that the thin metallic layer on the upper surface of the heat sink is exposed. An interface layer made of a material such as nickel, chromium or gold can be formed on the thin metallic layer on the upper surface of the heat sink so as to facilitate removal of the part of the encapsulant above the thin metallic layer on the upper surface of the heat sink. Moreover, a part of the thin metallic layer on the lower surface of the heat sink, which is in contact with the encapsulant, may be subjected to a blackening or browning treatment so as to enhance adhesion between the heat sink and the encapsulant.

In the fabrication method according to the present invention, a cutting tool is moved to cut the heat sink including the insulating core layer and thin metallic layers that are made of relatively soft materials during the singulation process, such that less wear of the cutting tool and less burrs of the heat sink are produced in the present invention as compared to the conventional technology having the cutting tool to cut the rigid metallic heat sink. This is advantageous for performing the singulation process and controlling the cost as well as for mass production of the semiconductor package in the present invention.

In the present invention, the chip carrier can be a substrate or a lead frame, and the semiconductor chip can be electrically connected to the chip carrier by a flip-chip method or a wire-bonding method. In the case of utilizing the flip-chip method to electrically connect the semiconductor chip to the chip carrier, the heat sink can be directly attached to a non-active surface of the semiconductor chip. Alternatively, in the case of utilizing the wire-bonding method to electrically connect the semiconductor chip to the chip carrier, a buffer pad with a CTE (Coefficient of Thermal Expansion) substantially equal to that of the semiconductor chip can be mounted on an active surface of the semiconductor chip at a position not interfering with bonding wires, and then the heat sink is attached to the buffer pad, such that the heat sink is not directly attached to the semiconductor chip and not in contact with the bonding wires, and thermal stress produced by the heat sink to the semiconductor chip due to mismatch in CTE therebetween can be reduced.

The fabrication method according to the present invention is applicable for fabricating a single semiconductor package or performed in a batch-type manner for mass production of semiconductor packages. The batch-type fabrication method comprises: mounting a plurality of semiconductor chips on an array-type chip carrier module plate; mounting a heat sink on the semiconductor chips, the heat sink including an insulating core layer, thin metallic layers and at least one thermal via hole, and performing a molding process; and performing a singulation process to form a plurality of semiconductor packages each integrated with the singulated heat sink, such that mass production of the semiconductor package is achieved.

The present invention also proposes a heat dissipating semiconductor package, comprising: a chip carrier; a semiconductor chip mounted on and electrically connected to the chip carrier; a heat sink mounted on the semiconductor chip, the heat sink including an insulating core layer, a thin metallic layer formed on each of an upper surface and a lower surface of the insulating core layer, and at least one thermal via hole formed in the insulating core layer; and an encapsulant formed between the heat sink and the chip carrier, for encapsulating the semiconductor chip.

In one embodiment of the present invention, the chip carrier is a BGA (Ball Grid Array) substrate having at least one through hole where bonding wires can penetrate for electrically connecting the semiconductor chip to the substrate that is mounted with the semiconductor chip on an upper surface thereof. A plurality of solder balls are implanted on a lower surface of the substrate and serve as media for electrically connecting the semiconductor chip to an external device.

In another embodiment of the present invention, the chip carrier is a flip-chip substrate, wherein an upper surface of the substrate is formed with a plurality of array-arranged bonding pads where a plurality of solder bumps are bonded for electrically connecting the semiconductor chip to the substrate. A plurality of solder balls are implanted on a lower surface of the substrate, for electrically connecting the semiconductor chip to an external device.

In a further embodiment of the present invention, the chip carrier is a lead frame without a die pad, wherein the semiconductor chip is mounted on and electrically connected to leads of the lead frame by a flip-chip method, and can be subsequently electrically connected to an external device via the leads.

In a further embodiment of the present invention, the chip carrier is a LGA (Land Grid Array) substrate, wherein the semiconductor chip is mounted via its non-active surface on an upper surface of the LGA substrate and is electrically connected to the LGA substrate by bonding wires, such that the semiconductor chip can be subsequently electrically connected to an external device via a plurality of metal contacts formed on a lower surface of the substrate.

In a further embodiment of the present invention, the chip carrier is a BGA substrate, wherein the semiconductor chip is mounted via its non-active surface on an upper surface of the BGA substrate and is electrically connected to the BGA substrate by bonding wires, such that the semiconductor chip can be subsequently electrically connected to an external device via a plurality of solder balls formed on a lower surface of the substrate.

In a further embodiment of the present invention, the chip carrier is a QFN (Quad Flat Non-leaded) lead frame, wherein the semiconductor chip is mounted via its non-active surface on a die pad of the QFN lead frame and is electrically connected to leads of the QFN lead frame by bonding wires, such that the semiconductor chip can be subsequently electrically connected to an external device via the leads.

It should be noted that, in the heat dissipating semiconductor package and the fabrication method thereof according to the present invention, the chip carrier and the electrical connection method between the semiconductor chip and the chip carrier can be selected to have various combinations and various modifications, without departing from the scope and spirit of the present invention.

Therefore, according to the heat dissipating semiconductor package and the fabrication method thereof in the present invention, a semiconductor chip is mounted on and electrically connected to a chip carrier, and a heat sink is mounted on the semiconductor chip, wherein the heat sink includes an insulating core layer, thin metallic layers provided on upper and lower surfaces of the insulating core layer, and at least one thermal via hole. Then, a molding process is performed to completely encapsulate the semiconductor chip on the chip carrier and the heat sink with an encapsulant to form a package unit. Subsequently, a singulation process is performed to remove peripheral non-electrical portions of the package unit after completing the molding process. A part of the encapsulant above the thin metallic layer on the upper surface of the heat sink is removed, such that the thin metallic layer on the upper surface of the heat sink is exposed. During the singulation process, the cutting tool is moved to cut the insulating core layer and thin metallic layers of the heat sink which are made of relatively soft materials, such that less wear of the cutting tool and less burrs of the heat sink are produced as compared to the conventional technology having the cutting tool to cut the rigid metallic heat sink. This is advantageous for performing the singulation process and controlling the cost as well as for mass production of the semiconductor package in the present invention.

The semiconductor package in the present invention can be fabricated in a batch-type method, thereby simplifying the fabrication processes, reducing the packaging time and lowering the cost. Since the part of the encapsulant above the heat sink is removed after the heat sink and the semiconductor chip have been completely encapsulated by the encapsulant in the molding process, the problems of chip cracks or resin flashes occurring in the conventional semiconductor packaging processes can be avoided, thereby not causing an adverse influence on the appearance of the semiconductor package and not requiring additional cost for performing a deflashing process. The present invention does not have a concern of height control on attaching the heat sink to the semiconductor chip, and needs not to change an encapsulation mold used in the molding process in response to variations in the size of the product, thereby reducing the packaging cost and tool management cost.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of a heat dissipating semiconductor package and a fabrication method thereof proposed in the present invention are described as follows with reference to FIGS. 4 to 10.

First Embodiment

FIGS. 4A to 4F show procedural steps of a fabrication method of a heat dissipating semiconductor package according to a first embodiment of the present invention.

Figure 1:
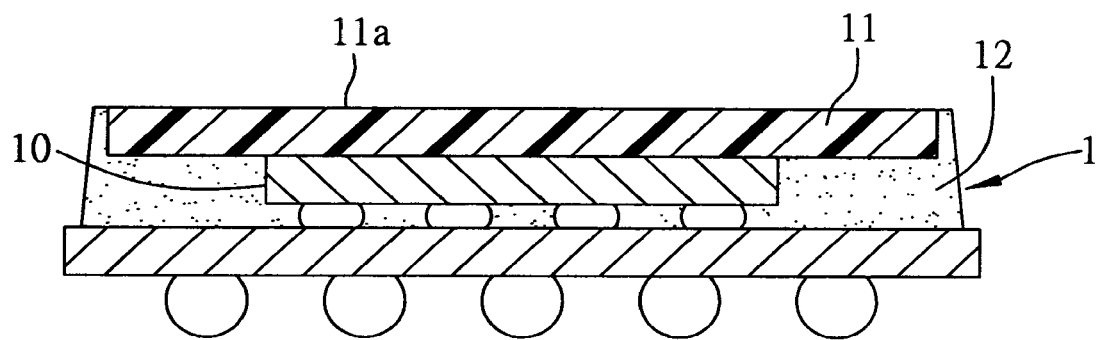
FIG. 1 (PRIOR ART) is a cross-sectional view of a semiconductor package disclosed by U.S. Pat. No. 5,726,079.
Figure 2A:
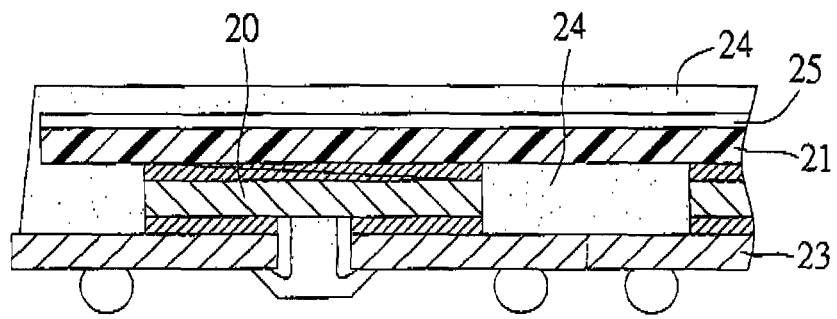
FIGS. 2A to 2C (PRIOR ART) are cross-sectional views of procedural steps of a fabrication method of a semiconductor package disclosed by U.S. Pat. No. 6,458,626.
Figure 2B:
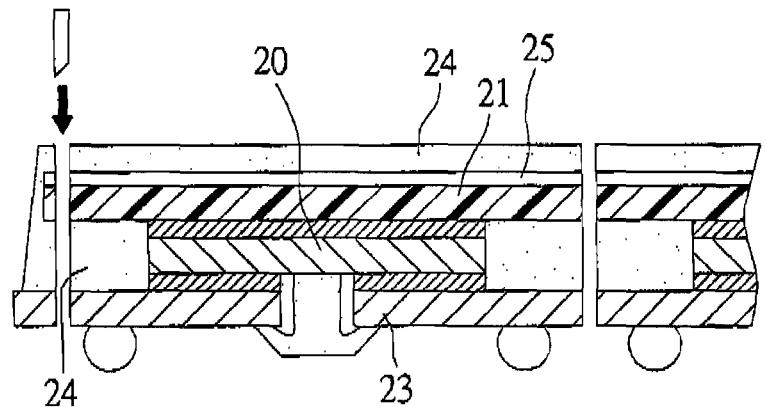
Figure 2C:
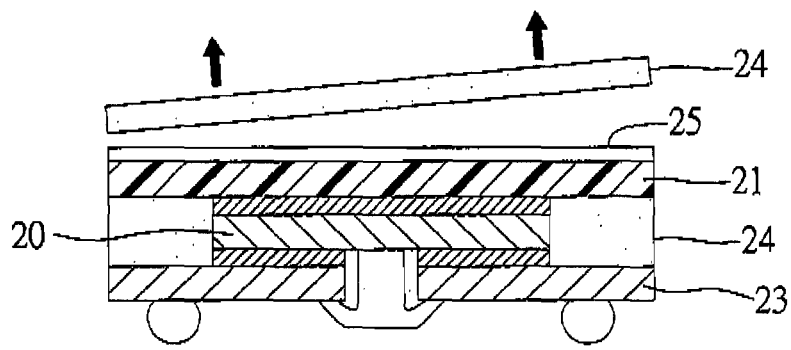
Figure 3:
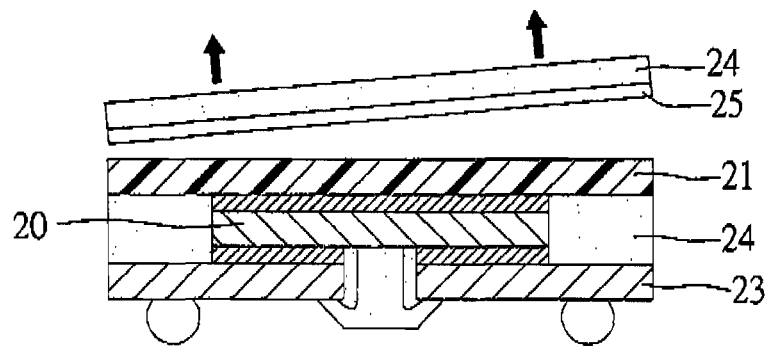
FIG. 3 (PRIOR ART) is a cross-sectional view of a semiconductor package disclosed by U.S. Pat. No. 6,444,498.
Figure 4A:
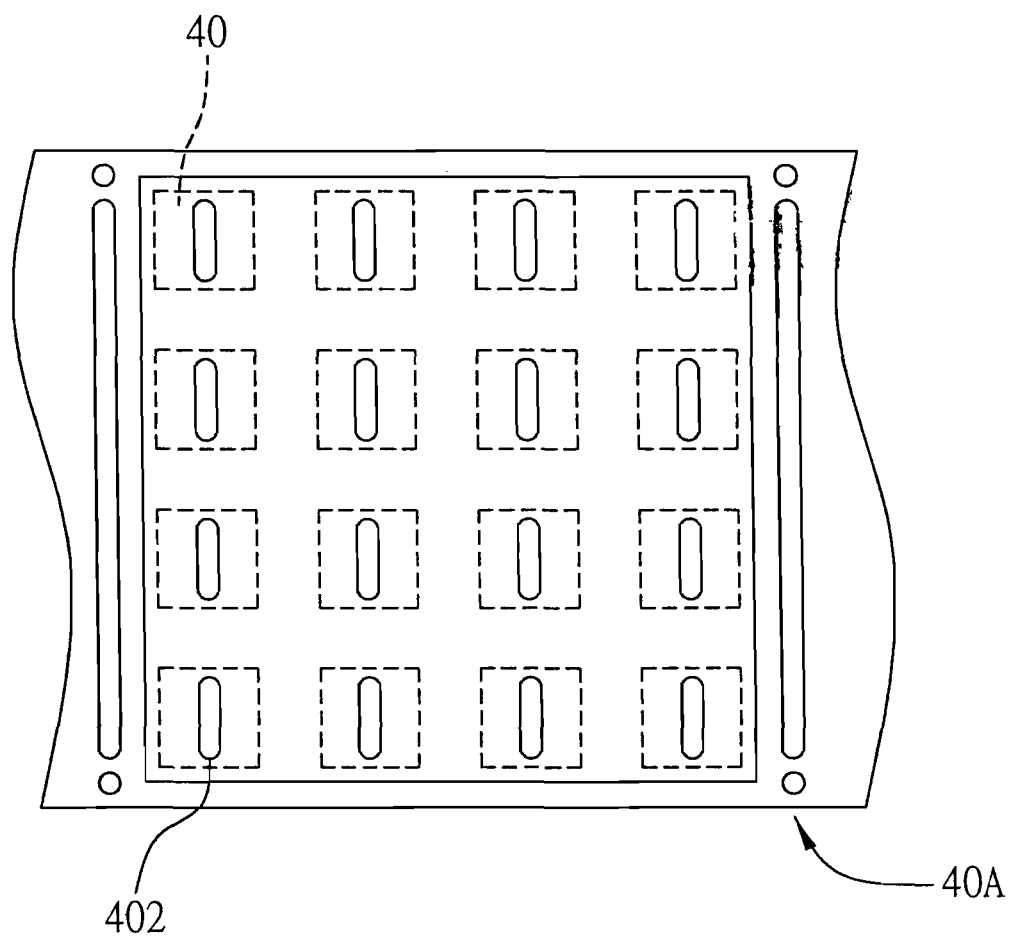
FIGS. 4A to 4F are schematic diagrams of procedural steps of a fabrication method of a heat dissipating semiconductor package according to a first embodiment of the present invention.
Figure 4B:
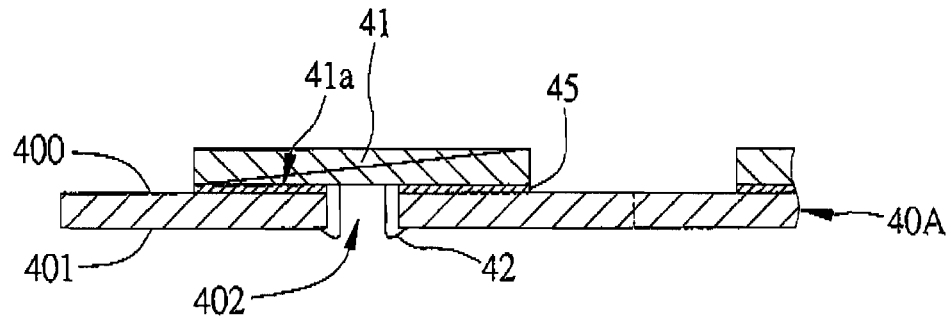

As shown in FIGS. 4A and 4B, an array-type chip carrier module plate such as a substrate module plate 40A is provided, which includes a plurality of chip carriers such as substrates 40 arranged in an array. Each of the substrates 40 comprises an upper surface 400, a lower surface 401, and a through hole 402 formed therein. It should be noted that, in addition to being arranged in an array, the substrates 40 may also be arranged in a strip, or the fabrication method may be performed using a single substrate under appropriate process conditions.

Then, an active surface 41a of a semiconductor chip 41 is mounted at a predetermined position on the upper surface 400 of each of the substrates 40 by an adhesion layer 45 such as silver paste, with one end of the through hole 402 of each of the substrates 40 being sealed by the chip 41. A plurality of bonding wires 42 penetrating the through hole 402 of each of the substrates 40 are bonded to the active surface 41a of the chip 41 and the lower surface 401 of each of the substrates 40 respectively, so as to electrically connect the chip 41 to each of the substrates 40.

Figure 4C:
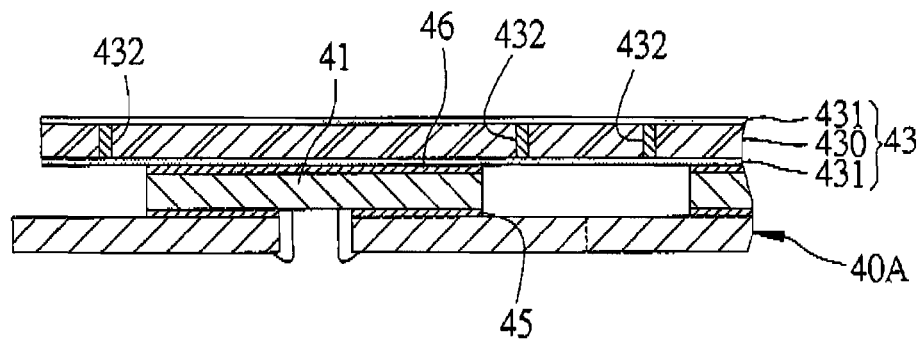

As shown in FIG. 4C, a heat sink 43 is mounted on the chips 41 by a thermally conductive adhesion layer 46. The heat sink 43 includes an insulating core layer 430, a thin metallic layer 431 formed on each of an upper surface and a lower surface of the insulating core layer 430, and at least one thermal via hole 432 formed in the insulating core layer 430. The insulating core layer 430 can be made of BT (Bismaleimide Triazine) resin, or FR4 resin, etc. The thin metallic layer 431 can be a copper foil. The thermal via hole 432 can be a copper-plated hole. As is often the case, the heat sink 43 may be a resin coated copper foil (RCC) formed with a copper-plated hole therein. An interface layer (not shown) made of a material such as nickel, chromium or gold may further be formed on the thin metallic layer 431 on the upper surface of the insulating core layer 430 by e.g. an electroplating method, so as to facilitate removal of a subsequently-fabricated encapsulant above the thin metallic layer 431 on the upper surface of the insulating core layer 430. The thin metallic layer 431 on the lower surface of the insulating core layer 430 may be subjected to a blackening treatment or a browning treatment, so as to enhance adhesion between the thin metallic layer 431 on the lower surface of the insulating core layer 430 and the encapsulant. The heat sink 43 should have a size sufficient to completely cover the substrates 40 that are connected with the heat sink 43 via the chips 41.

Figure 4D:
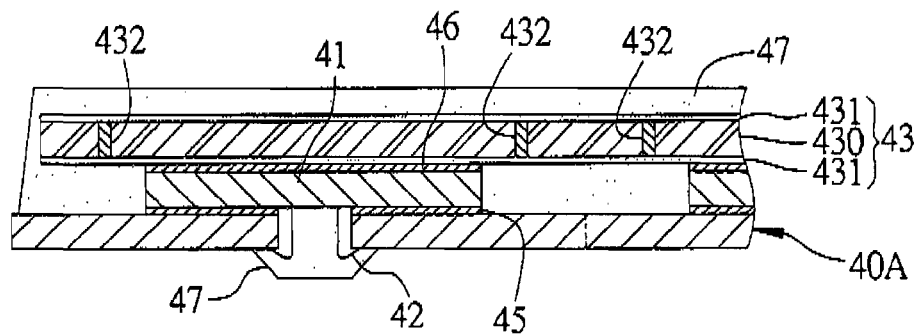

As shown in FIG. 4D, the substrate module plate 40A mounted with the chips 41 and the heat sink 43 thereon is placed into a mold cavity of an encapsulation mold (not shown) to perform a molding process and form an encapsulant 47 for encapsulating the heat sink 43, the chips 41 and the bonding wires 42. The encapsulant 47 can be made of a resin material such as epoxy resin. During the molding process, the heat sink 43 is allowed to be spaced apart from a top wall of the mold cavity by an appropriate distance, such that the chips 41 do not suffer a pressure from the encapsulation mold or the heat sink 43 and are thus not cracked. There is no need to have precise height control on attaching the heat sink 43 to the chips 41, thereby effectively improving the yield and reliability of fabricated products.

Figure 4E:
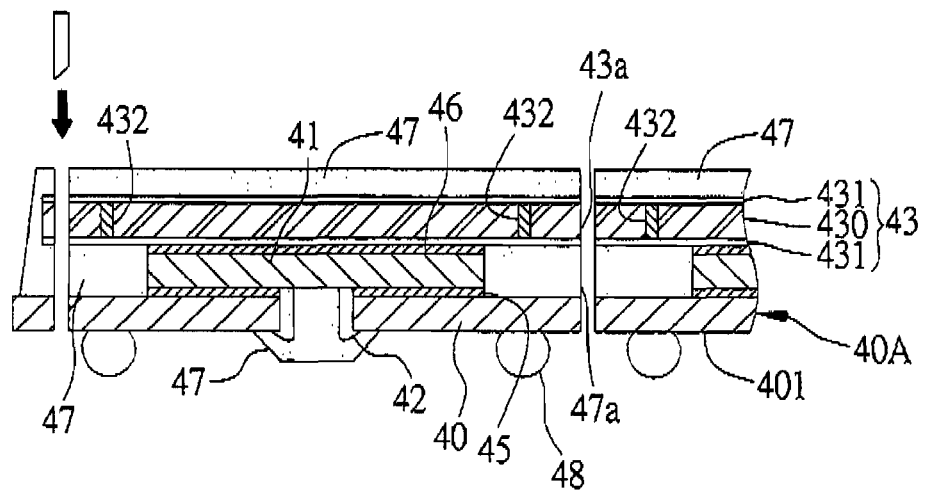

As shown in FIG. 4E, a plurality of conductive elements such as solder balls 48 are implanted on the lower surface 401 of each of the substrates 40 of the substrate module plate 40A, so as to electrical connect the chips 41 to an external device via the solder balls 48. Then, a singulation process is performed to separate the substrates 40 from each other, wherein a part of the encapsulant 47 on the heat sink 43 of the semi-finished product that has been implanted with the solder balls 48 is held by a jig (not shown) using vacuum force, such that the semi-finished product can be held on the jig during and after the singulation process. Alternatively, implantation of the solder balls 48 may be performed after completing the singulation process of the substrates 40.

The singulation process can remove peripheral non-electrical portions of package units that have been performed with the molding process, to thereby form the individual package units after singulation, wherein sides 43a of the heat sink 43 are exposed from the encapsulant 47 and are coplanar with sides 47a of the encapsulant 47, without having resin flashes on the sides 43a of the heat sink 43, and the heat sink 43 has an area same as that of the substrate 40 in each of the individual package units, without a need to precisely correspond the size of the heat sink 43 to the size of the mold cavity of the encapsulation mold. The attachment between the chips 41 and the heat sink 43 is performed by a batch-type method, thereby simplifying the fabrication processes, reducing the fabrication time and lowering the cost. A cutting tool in the singulation process is moved to easily cut the insulating core layer 430 and thin metallic layers 431 of the heat sink 43 which are made of relatively soft materials, such that less wear of the cutting tool and less burrs of the heat sink are produced as compared to the conventional technology having the cutting tool to cut the rigid metallic heat sink. This is advantageous for performing the singulation process and controlling the cost as well as for mass production of the semiconductor package in the present invention.

Figure 4F:
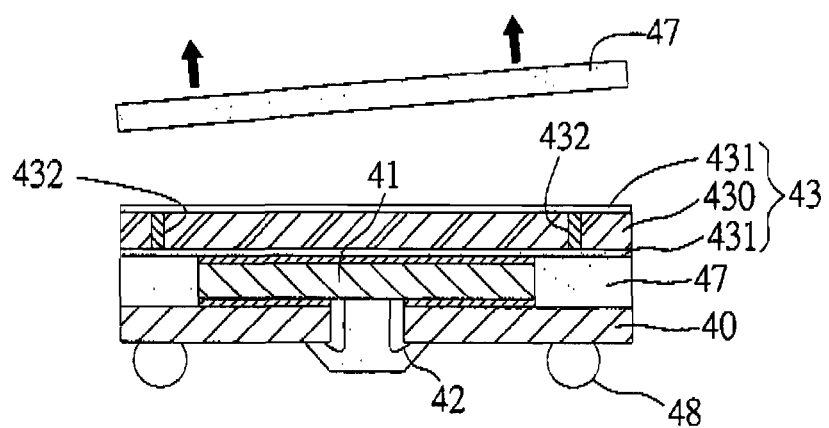

As shown in FIG. 4F, a part of the encapsulant 47 remaining above the thin metallic layer 431 on the upper surface of the heat sink 43 is removed by e.g. stripping in each of the individual package units, such that the thin metallic layer 431 on the upper surface of the heat sink 43 is exposed, and heat generated by the chip 41 can be dissipated through the thin metallic layers 431 and the thermal via hole 432 of the heat sink 43.

Second Embodiment

FIGS. 5A to 5G show procedural steps of a fabrication method of a heat dissipating semiconductor package according to a second embodiment of the present invention. The fabrication method of the second embodiment is similar to that of the first embodiment, with a primary difference in that a semiconductor chip in the second embodiment is mounted on and electrically connected to a substrate by a flip-chip method.

Figure 5A:
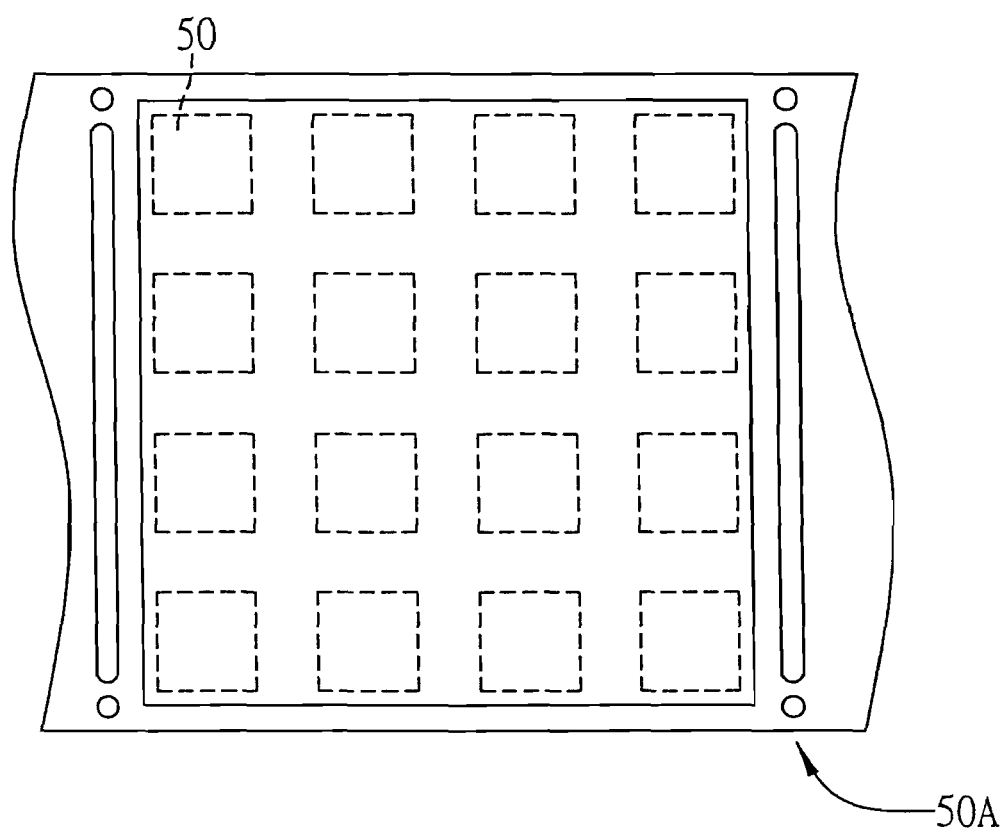
FIGS. 5A to 5F are schematic diagrams of procedural steps of a fabrication method of a beat dissipating semiconductor package according to a second embodiment of the present invention.
Figure 5B:
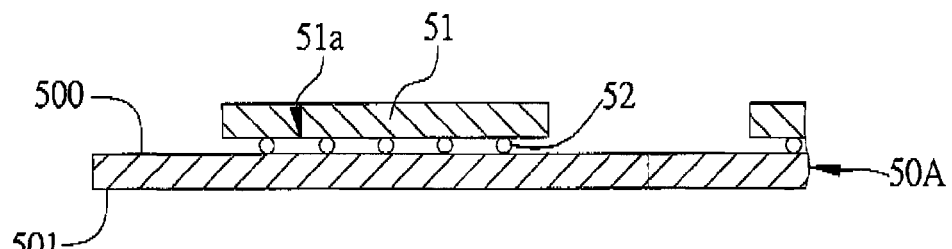

As shown in FIGS. 5A and 5B, an array-type chip carrier module plate such as a substrate module plate 50A is prepared, which includes a plurality of chip carriers such as substrates 50 arranged in an array. Each of the substrates 50 comprises an upper surface 500 and a lower surface 501. It should be noted that, in addition to being arranged in an array, the substrates 50 may also be arranged in a strip, or the fabrication method may be performed using a single substrate under appropriate process conditions.

Next, an active surface 51 a of a semiconductor chip 51 is mounted on and electrically connected to a predetermined position on the upper surface 500 of each of the substrates 50 by a plurality of solder bumps 52 using a flip-chip method. An underfill material (not shown) may further be applied between the flip-chip type semiconductor chip 51 and each of the substrates 50. The flip-chip process is known in the art and not to be further described herein.

Figure 5C:
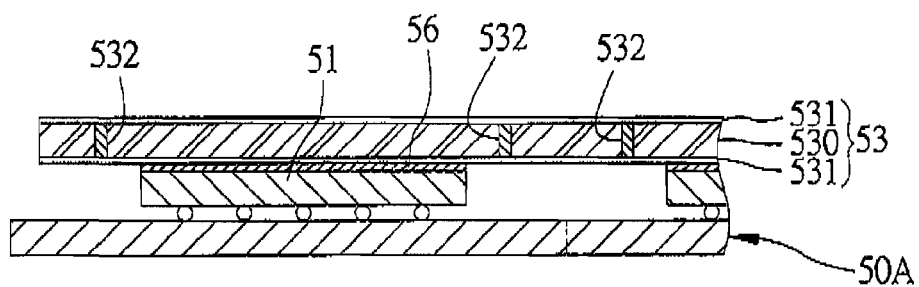

As shown in FIG. 5C, a heat sink 53 is mounted on the chips 51 by a thermally conductive adhesion layer 56. The heat sink 53 includes an insulating core layer 530, a thin metallic layer 531 formed on each of an upper surface and a lower surface of the insulating core layer 530, and at least one thermal via hole 532 formed in the insulating core layer 530. The insulating core layer 530 may be made of BT (Bismaleimide Triazine) resin or FR4 resin, etc. The thin metallic layer 531 may be a copper foil. The thermal via hole 532 may be a copper-plated hole. As is often the case, the heat sink 53 may be a resin coated copper foil (RCC) formed with a copper-plated hole therein. An interface layer (not shown) made of a material such as nickel, chromium or gold can further be formed on the thin metallic layer 531 on the upper surface of the insulating core layer 530, so as to facilitate removal of a subsequently-fabricated encapsulant formed above the thin metallic layer 531 on the upper surface of the insulating core layer 530. The thin metallic layer 531 on the lower surface of the insulating core layer 530 can be subjected to a blackening treatment or a browning treatment, so as to enhance adhesion between the thin metallic layer 531 on the lower surface of the insulating core layer 530 and the encapsulant. The heat sink 53 should have a size sufficient to completely cover the substrates 50 that are connected with the heat sink 53 via the chips 51.

Figure 5D:
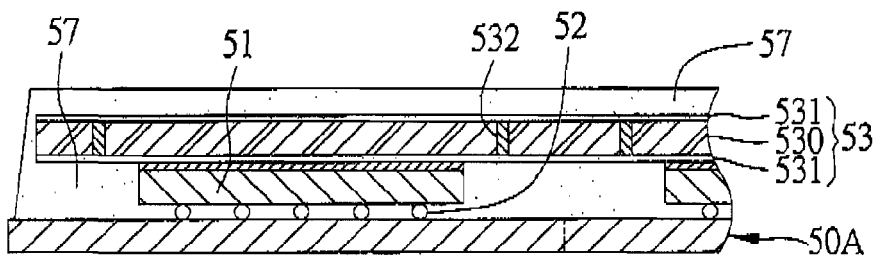

As shown in FIG. 5D, the substrate module plate 50A mounted with the chips 51 and the heat sink 53 thereon is placed into a mold cavity of an encapsulation mold (not shown) to perform a molding process and form an encapsulant 57 for encapsulating the heat sink 53, the chips 51 and the solder bumps 52. During the molding process, the heat sink 53 is allowed to be spaced apart from a top wall of the mold cavity by an appropriate distance, such that the chips 51 do not suffer a pressure from the encapsulation mold or the heat sink 53 and are thus not cracked. There is no need to have precise height control on attaching the heat sink 53 to the chips 51, thereby effectively improving the yield and reliability of fabricated products.

Figure 5E:
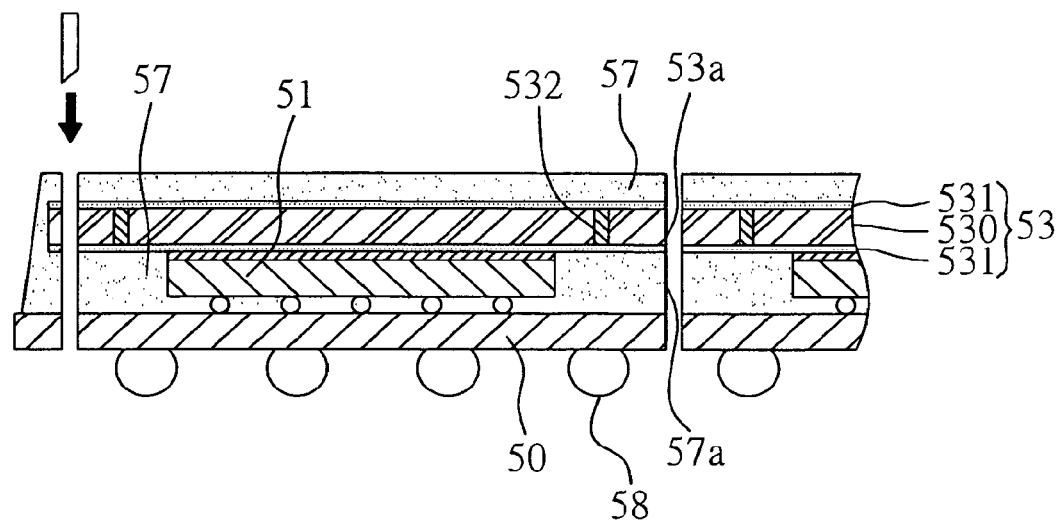

As shown in FIG. 5E, a plurality of conductive elements such as solder balls 58 are implanted on the lower surface 501 of each of the substrates 50 of the substrate module plate 50A, so as to electrical connect the chips 51 to an external device via the solder balls 58. Then, a singulation process is performed to separate the substrates 50 from each other, wherein a part of the encapsulant 57 formed on the heat sink 53 of the semi-finished product that has been implanted with the solder balls 58 is held by a jig (not shown) using vacuum force, such that the semi-finished product can be held on the jig during and after the singulation process. Alternatively, implantation of the solder balls 58 may be performed after completing the singulation process of the substrates 50.

After singulation, sides 53a of the heat sink 53 are exposed from the encapsulant 57 and are flush with sides 57a of the encapsulant 57, without having resin flashes on the sides 53a of the heat sink 53, and the heat sink 53 has an area same as that of the substrate 50, without a need to precisely correspond the size of the heat sink 53 to the size of the mold cavity of the encapsulation mold. The attachment between the chips 51 and the heat sink 53 is performed by a batch-type method, thereby simplifying the fabrication processes, reducing the fabrication time and lowering the cost.

Figure 5F:
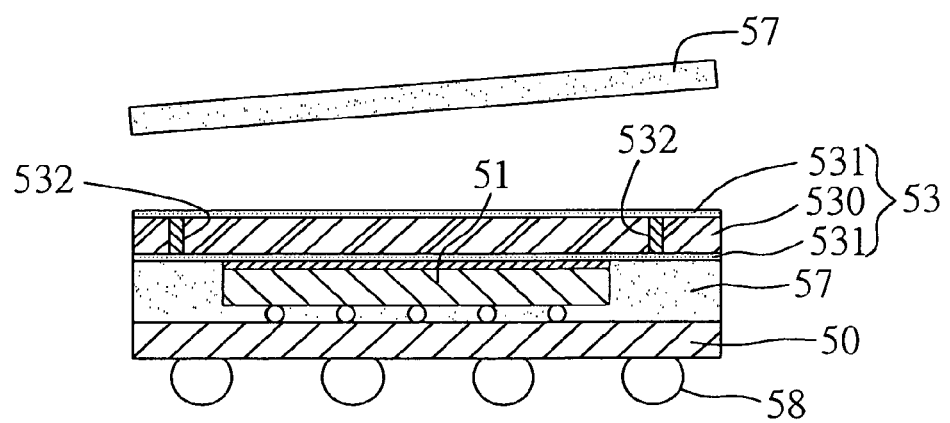

As shown in FIG. 5F, a part of the encapsulant 57 remaining above the thin metallic layer 531 on the upper surface of the heat sink 53 is removed in each of the singulated package units, such that the thin metallic layer 531 on the upper surface of the heat sink 53 is exposed, and heat generated by the chip 51 can be dissipated through the thin metallic layers 531 and the thermal via hole 532 of the heat sink 53.

Third Embodiment

Figure 6:
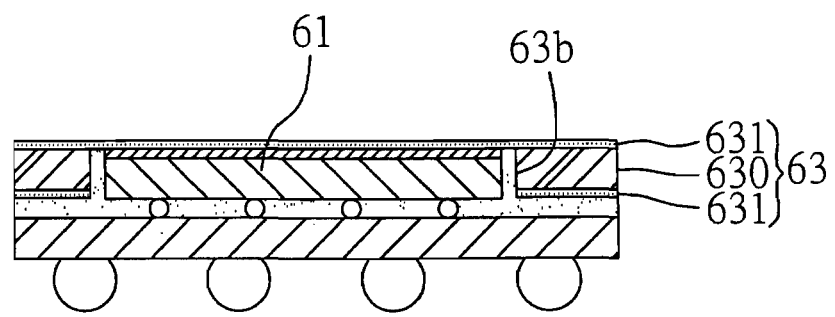
FIG. 6 is a cross-sectional view of a heat dissipating semiconductor package according to a third embodiment of the present invention.

FIG. 6 shows a cross-sectional view of a semiconductor package according to a third embodiment of the present invention. The semiconductor package of third embodiment is fabricated by a method similar to the fabrication methods in the first and second embodiments, with a primary difference in that in the third embodiment, a heat sink 63 attached to a semiconductor chip 61 is formed with an opening 63b at a position corresponding to the chip 61. Particularly, a part of an insulating core layer 630 and a part of a thin metallic layer 631 on a lower surface of the heat sink 63 corresponding in position to the chip 61 are removed to thereby form the opening 63b via which a part of a thin metallic layer 631 on an upper surface of the heat sink 63 is exposed. When attaching the heat sink 63 to the chip 61, the chip 61 can be received in the opening 63b, thereby further reducing the height of the semiconductor package. Moreover, a non-active surface of the chip 61 is in contact with the thin metallic layer 631 on the upper surface of the heat sink 63, such that heat generated by the chip 61 can be directly dissipated out of the semiconductor package through the thin metallic layer 631 on the upper surface of the heat sink 63, thus improving the heat dissipating efficiency.

Fourth Embodiment

Figure 7:
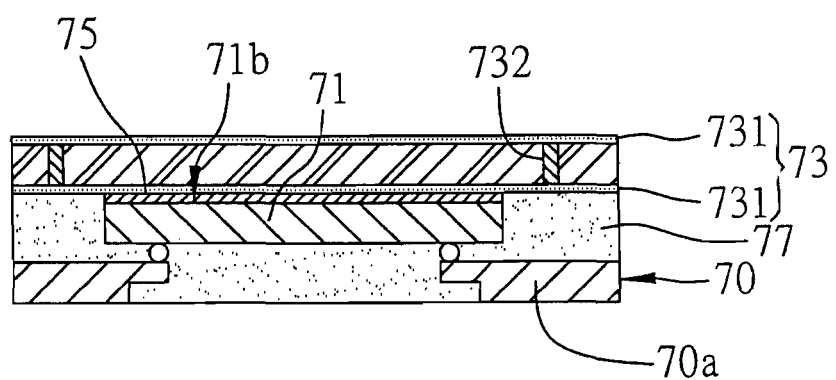
FIG. 7 is a cross-sectional view of a heat dissipating semiconductor package according to a fourth embodiment of the present invention.

FIG. 7 is a cross-sectional view of a semiconductor package according to a fourth embodiment of the present invention. The semiconductor package of the fourth embodiment is fabricated by a method similar to the fabrication methods in the first and second embodiments, with a primary difference in that in the fourth embodiment, a lead frame 70 is used as the chip carrier for a semiconductor chip 71, and the chip 71 is mounted on and electrically connected to leads 70a of the lead frame 70 by a flip-chip method, such that the chip 71 can subsequently be electrically connected to an external device via the leads 70a. A heat sink 73 is mounted on a non-active surface 71b of the chip 71 by e.g. a thermally conductive adhesion layer 75, such that heat generated by the chip 71 can be dissipated through thin metallic layers 731 and at least one thermal via hole 732 of the heat sink 73. An encapsulant 77 is formed between the heat sink 73 and the lead frame 70 for encapsulating the chip 71, wherein lower surfaces and sides of the leads 70a are exposed from the encapsulant 77, such that the semiconductor package can be electrically connected to the external device via the leads 70a.

Similarly to the arrangement shown in FIG. 6, the heat sink may be formed with an opening at a position corresponding to the chip, such that the chip is received in the opening, making the height of the semiconductor package reduced, and the non-active surface of the chip is in contact with the thin metallic layer on the upper surface of the heat sink, thereby allowing the heat generated by the chip to be directly dissipated through the thin metallic layer on the upper surface of the heat sink and improving the heat dissipating efficiency.

Fifth Embodiment

Figure 8:
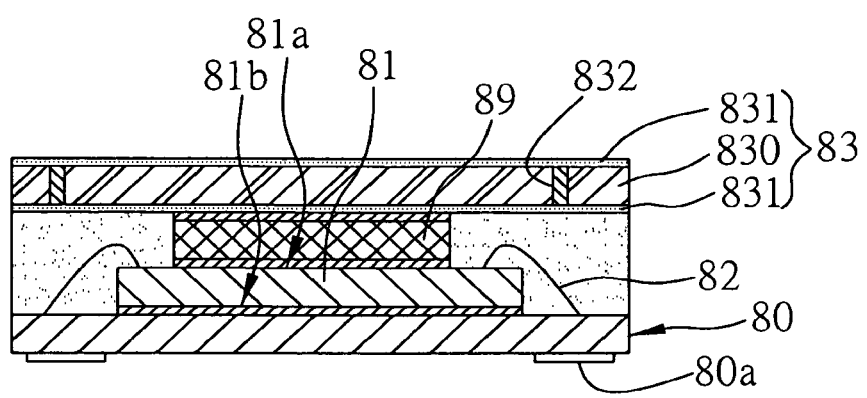
FIG. 8 is a cross-sectional view of a heat dissipating semiconductor package according to a fifth embodiment of the present invention.

FIG. 8 is a cross-sectional view of a semiconductor package according to a fifth embodiment of the present invention. The semiconductor package of the fifth embodiment is fabricated by a method similar to the fabrication methods in the first and second embodiments, with a primary difference in that in the fifth embodiment, a LGA (Land Grid Array) substrate 80 is used as the chip carrier for a semiconductor chip 81, such that a non-active surface 81b of the chip 81 is mounted on the LGA substrate 80, and an active surface 81a of the chip 81 is electrically connected to the LGA substrate 80 by bonding wires 82, allowing the chip 81 to subsequently be electrically connected to an external device via a plurality of metal contacts 80a formed on a lower surface of the LGA substrate 80. A buffer pad 89 having a CTE (Coefficient of Thermal Expansion) substantially equal to that of the chip 81 is disposed on the active surface 81a of the chip 81 at a position not interfering with the bonding wires 82, and a heat sink 83 including an insulating core layer 830, thin metallic layers 831 and at least one thermal via hole 832 is mounted on the buffer pad 89, such that beat generated by the chip 81 can be dissipated through the thin metallic layers 831 and thermal via hole 832 of the heat sink 83.

The size of the buffer pad 89 is made as not interfering with the bonding wires 82, and the thickness of the buffer pad 89 should be slightly larger than the height of wire loops of the bonding wires 82. Thus, when the heat sink 83 is mounted on the buffer pad 89, the heat sink 83 does not come into contact with the bonding wires 82. The buffer pad 89 can reduce thermal stress produced by the heat sink 83 to the chip 81 due to mismatch in CTE therebetween under a high temperature environment, thereby ensuring that the chip 81 is not damaged by the thermal stress, and heat generated by the chip 81 can still be dissipated to the heat sink 83 through the buffer pad 89. The buffer pad 89 is made of a thermally conductive material such as a dummy die or a metal such as copper, aluminum or the like.

Similarly to the arrangement shown in FIG. 6, the heat sink may be formed with an opening at a position corresponding to the chip, such that the chip is received in the opening, making the height of the semiconductor package reduced, and the non-active surface of the chip is in contact with the thin metallic layer on the upper surface of the heat sink, thereby allowing the heat generated by the chip to be directly dissipated through the thin metallic layer on the upper surface of the heat sink and improving the heat dissipating efficiency.

Sixth Embodiment

Figure 9:
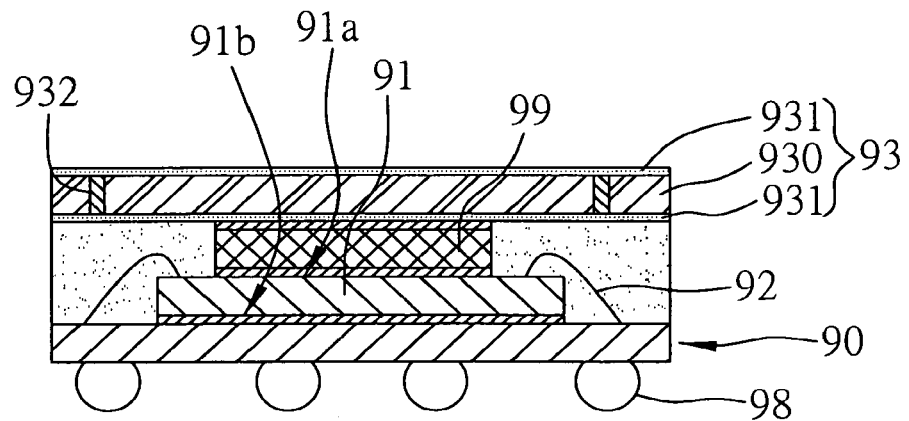
FIG. 9 is a cross-sectional view of a heat dissipating semiconductor package according to a sixth embodiment of the present invention.

FIG. 9 is a cross-sectional view of a semiconductor package according to a sixth embodiment of the present invention. The semiconductor package of the sixth embodiment is fabricated by a method similar to the fabrication methods in the first and second embodiments, with a primary difference in that in the sixth embodiment, a BGA (Ball Grid Array) substrate 90 is used as the chip carrier for a semiconductor chip 91, such that a non-active surface 91b of the chip 91 is mounted on the BGA substrate 90, and an active surface 91a of the chip 91 is electrically connected to the BGA substrate 90 by bonding wires 92, allowing the chip 91 to subsequently be electrically connect to an external device via a plurality of solder balls 98 formed on a lower surface of the BGA substrate 90. A buffer pad 99 having a CTE substantially equal to that of the chip 91 is disposed on the active surface 91a of the chip 91 at a position not interfering with the bonding wires 92, and a heat sink 93 including an insulating core layer 930, thin metallic layers 931 and at least one thermal via hole 932 is mounted on the buffer pad 99, such that heat generated by the chip 91 can be dissipated through the thin metallic layers 931 and thermal via hole 932 of the heat sink 93.

Similarly to the arrangement shown in FIG. 6, the heat sink may be formed with an opening at a position corresponding to the chip, such that the chip is received in the opening, making the height of the semiconductor package reduced, and the non-active surface of the chip is in contact with the thin metallic layer on the upper surface of the heat sink, thereby allowing the heat generated by the chip to be directly dissipated through the thin metallic layer on the upper surface of the heat sink and improving the heat dissipating efficiency.

Seventh Embodiment

Figure 10:
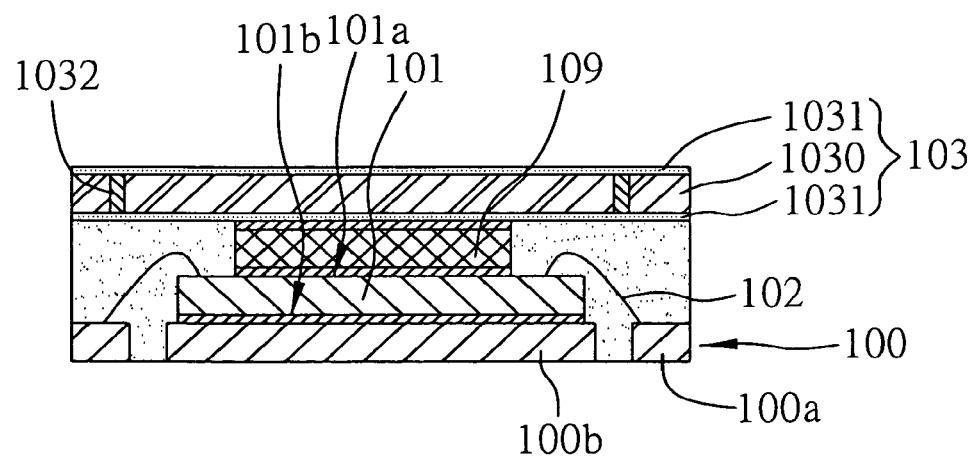
FIG. 10 is a cross-sectional view of a heat dissipating semiconductor package according to a seventh embodiment of the present invention.

FIG. 10 is a cross-sectional view of a semiconductor package according to a seventh embodiment of the present invention. The semiconductor package of the seventh embodiment is fabricated by a method similar to the fabrication methods in the first and second embodiments, with a primary difference in that in the seventh embodiment, a QFN (Quad Flat Non-leaded) lead frame 100 is utilized as the chip carrier for a semiconductor chip 101, such that a non-active surface 101b of the chip 101 is mounted on a die pad 100b of the QFN lead frame 100, and an active surface 101a of the chip 101 is electrically connected to leads 100a of the QFN lead frame 100 by bonding wires 102, allowing the chip 101 to subsequently be electrically connected to an external device via the leads 100a. A buffer pad 109 having a CTE substantially equal to that of the chip 101 is disposed on the active surface 101a of the chip 101 at a position not interfering with the bonding wires 102, and a heat sink 103 including an insulating core layer 1030, thin metallic layers 1031 and at least one thermal via hole 1032 is mounted on the buffer pad 109, such that heat generated by the chip 101 can be dissipated through the thin metallic layers 1031 and thermal via hole 1032 of the heat sink 103.

Similarly to the arrangement shown in FIG. 6, the heat sink may be formed with an opening at a position corresponding to the chip, such that the chip is received in the opening, making the height of the semiconductor package reduced, and the non-active surface of the chip is in contact with the thin metallic layer on the upper surface of the heat sink, thereby allowing the heat generated by the chip to be directly dissipated through the thin metallic layer on the upper surface of the heat sink and improving the heat dissipating efficiency.

Therefore, according to the heat dissipating semiconductor package and the fabrication method thereof in the present invention, a semiconductor chip is mounted on and electrically connected to a chip carrier, and a heat sink is mounted on the semiconductor chip, wherein the heat sink includes an insulating core layer, thin metallic layers provided on upper and lower surfaces of the insulating core layer, and at least one thermal via hole. Then, a molding process is performed to completely encapsulate the semiconductor chip on the chip carrier and the heat sink with an encapsulant to form a package unit. Subsequently, a singulation process is performed to remove peripheral non-electrical portions of the package unit after completing the molding process. A part of the encapsulant above the thin metallic layer on the upper surface of the heat sink is removed, such that the thin metallic layer on the upper surface of the heat sink is exposed. During the singulation process, the cutting tool is moved to cut the insulating core layer and thin metallic layers of the heat sink which are made of relatively soft materials, such that less wear of the cutting tool and less burrs of the heat sink are produced as compared to the conventional technology having the cutting tool to cut the rigid metallic heat sink. This is advantageous for performing the singulation process and controlling the cost as well as for mass production of the semiconductor package in the present invention.

The semiconductor package in the present invention can be fabricated in a batch-type method, thereby simplifying the fabrication processes, reducing the packaging time and lowering the cost. Since the part of the encapsulant above the heat sink is removed after the heat sink and the semiconductor chip have been completely encapsulated by the encapsulant in the molding process, the problems of chip cracks or resin flashes occurring in the conventional semiconductor packaging processes can be avoided, thereby not causing an adverse influence on the appearance of the semiconductor package and not requiring additional cost for performing a deflashing process. The present invention does not have a concern of height control on attaching the heat sink to the semiconductor chip, and needs not to change an encapsulation mold used in the molding process in response to variations in the size of the product, thereby reducing the packaging cost and tool management cost.

The present invention has been described using exemplary preferred embodiments. However, it is to be understood that the scope of the invention is not limited to the disclosed embodiments. On the contrary, it is intended to cover various modifications and similar arrangements, for example, the chip carrier and the electrical connecting method between the semiconductor chip and the chip carrier can be selected to have various combinations and incorporate various modifications, without departing from the spirit and scope of the present invention. The scope of the claims, therefore, should be accorded the broadest interpretation so as to encompass all such modifications and similar arrangements.

What is claimed is:

1. A fabrication method of a heat dissipating semiconductor package, comprising the steps of:
    mounting and electrically connecting at least one semiconductor chip to a chip carrier;
    mounting a heat sink on the semiconductor chip, wherein the heat sink includes an insulating core layer, a thin metallic layer formed on each of an upper surface and a lower surface of the insulating core layer, and at least one thermal via hole formed in the insulating core layer, and the heat sink is further formed with an opening at a position corresponding to the semiconductor chip, such that a part of the thin metallic layer on the upper surface of the insulating core layer of the heat sink is exposed via the opening of the heat sink, and the semiconductor chip is received in the opening of the heat sink and in contact with the thin metallic layer on the upper surface of the insulating core layer of the heat sink;
    performing a molding process to form an encapsulant for completely encapsulating the semiconductor chip on the chip carrier and the heat sink so as to form a package unit; and
    performing a singulation process to peripherally cut the package unit, and removing a part of the encapsulant above the thin metallic layer on the upper surface of the insulating core layer of the heat sink such that the thin metallic layer on the upper surface of the insulating core layer of the heat sink is exposed,
    wherein an interface layer is formed on the thin metallic layer on the upper surface of the insulating core layer of the heat sink, so as to facilitate removal of the part of the encapsulant above the thin metallic layer on the upper surface of the insulating core layer of the heat sink, and the interface layer is made of a material selected from the group consisting of nickel, chromium and gold.

2. The fabrication method of claim 1, wherein the chip carrier is one of a substrate and a lead frame, and the semiconductor chip is electrically connected to the chip carrier by one of a wire-bonding method and a flip-chip method.

3. The fabrication method of claim 1, wherein a plurality of conductive elements are disposed on the chip carrier, for electrically connecting the semiconductor chip to an external device.

4. The fabrication method of claim 1, wherein after mounting and electrically connecting the semiconductor chip to the chip carrier, a buffer pad is attached to the semiconductor chip and the heat sink is mounted on the buffer pad.

5. The fabrication method of claim 4, wherein the buffer pad is made of one of a dummy die and a metal.

6. The fabrication method of claim 1, wherein the insulating core layer is made of one of BT (Bismaleimide Triazine) resin and FR4 resin, the thin metallic layer is a copper foil, and the thermal via hole is a copper-plated hole.

7. The fabrication method of claim 1, wherein the thin metallic layer on the lower surface of the insulating core layer of the heat sink is subjected to one of a blackening treatment and a browning treatment, so as to enhance adhesion between the thin metallic layer on the lower surface of the insulating core layer of the heat sink and the encapsulant.

8. A fabrication method of a heat dissipating semiconductor package, comprising the steps of:
    preparing a chip carrier module plate comprising a plurality of chip carriers;
    mounting and electrically connecting at least one semiconductor chip to each of the chip carriers;
    mounting a heat sink on the semiconductor chips, wherein the heat sink includes an insulating core layer, a thin metallic layer formed on each of an upper surface and a lower surface of the insulating core layer, and at least one thermal via hole formed in the insulating core layer, and the heat sink is further formed with an opening at a position corresponding to the semiconductor chip, such that a part of the thin metallic layer on the upper surface of the insulating core layer of the heat sink is exposed via the opening of the heat sink, and the semiconductor chip is received in the opening of the heat sink and in contact with the thin metallic layer on the upper surface of the insulating core layer of the heat sink;
    performing a molding process to form an encapsulant for completely encapsulating the semiconductor chips on the chip carrier and the heat sink;
    performing a singulation process to form individual semi-finished package units; and
    removing a part of the encapsulant above the thin metallic layer on the upper surface of the insulating core layer of the heat sink, such that the thin metallic layer on the upper surface of the insulating core layer of the heat sink is exposed in each of the package units,
    wherein an interface layer is formed on the thin metallic layer on the upper surface of the insulating core layer of the heat sink, so as to facilitate removal of the part of the encapsulant above the thin metallic layer on the upper surface of the insulating core layer of the heat sink, and the interface layer is made of a material selected from the group consisting of nickel, chromium and gold.

9. The fabrication method of claim 8, wherein each of the chip carriers is one of a substrate and a lead frame, and the chip carriers are arranged in an array or a strip, such that the semiconductor chip is electrically connected to each of the chip carriers by one of a wire-bonding method and a flip-chip method.

10. The fabrication method of claim 8, wherein a plurality of conductive elements are disposed on each of the chip carriers, for electrically connecting the semiconductor chip to an external device.

11. The fabrication method of claim 8, wherein after mounting and electrically connecting the semiconductor chip to each of the chip carriers, a buffer pad is mounted on the semiconductor chip and the heat sink is attached to the buffer pad.

12. The fabrication method of claim 11, wherein the buffer pad is made of one of a dummy die and a metal.

13. The fabrication method of claim 8, wherein the insulating core layer is made of one of BT (Bismaleimide Triazine) resin and FR4 resin, the thin metallic layer is a copper foil, and the thermal via hole is a copper-plated hole.

14. The fabrication method of claim 8, wherein the thin metallic layer on the lower surface of the insulating core layer of the heat sink is subjected to one of a blackening treatment and a browning treatment, so as to enhance adhesion between the thin metallic layer on the lower surface of the insulating core layer of the heat sink and the encapsulant.

* * * * *